(12) United States Patent
Matsueda (10) Patent No.: US 10,950,171 B2
(45) Date of Patent: Mar. 16, 2021

(54) DISPLAY DEVICE AND METHOD OF CONTROLLING THE SAME

(71) Applicant: TIANMA JAPAN, LTD., Kanagawa (JP)

(72) Inventor: Yojiro Matsueda, Kawasaki (JP)

(73) Assignees: TIANMA JAPAN, LTD., Kanagawa (JP); Wuhan Tianma Micro-Electronics Co., Ltd., Wuhan (CN)

(*) Notice: Subject to any disclaimer, the term of this patent is extended or adjusted under 35 U.S.C. 154(b) by 15 days.

(21) Appl. No.: 16/426,019

(22) Filed: May 30, 2019

(65) Prior Publication Data

US 2019/0371234 A1    Dec. 5, 2019

(30) Foreign Application Priority Data

Jun. 1, 2018 (JP) .............................. JP2018-106084

(51) Int. Cl.
*G09G 3/3225* (2016.01)
*G09G 3/3208* (2016.01)
*H01L 27/32* (2006.01)
*G09G 3/20* (2006.01)
*G09G 3/3266* (2016.01)

(52) U.S. Cl.
CPC ......... *G09G 3/3225* (2013.01); *G09G 3/3208* (2013.01); *H01L 27/326* (2013.01); *H01L 27/3218* (2013.01); *G09G 2300/0452* (2013.01)

(58) Field of Classification Search
CPC .. G09G 3/3225; G09G 3/3208; G09G 3/3266; G09G 3/3607; G09G 3/2003; G09G 2300/0452; G09G 2310/0232; G09G 2320/0242; G09G 2320/0626; G09G 2360/16; H01L 27/3218; H01L 27/326
See application file for complete search history.

(56) References Cited

U.S. PATENT DOCUMENTS

| 2012/0092238 A1* | 4/2012 | Hwang ................ G09G 3/3225 345/55 |
| 2017/0178554 A1 | 6/2017 | Xiao |
| 2018/0075797 A1* | 3/2018 | Park ..................... G09G 3/2092 |

* cited by examiner

*Primary Examiner* — David Tung
(74) *Attorney, Agent, or Firm* — Sughrue Mion, PLLC (57) ABSTRACT

A display device includes a display panel including a plurality of panel pixel lines, and a controller configured to control the display panel. The controller is configured to receive image data for a picture frame, generate luminance data for the display panel from the image data, and modify the luminance data for the display panel by raising luminance values of a red subpixel and a blue subpixel adjacent along a first display line to a green subpixel located at an end of the first display line at outside of the first display line, the first display line being composed of a plurality of panel pixels consecutive in the first direction and assigned luminance values higher than 0.

8 Claims, 9 Drawing Sheets

DISPLAY DEVICE AND METHOD OF CONTROLLING THE SAME

CROSS-REFERENCE TO RELATED APPLICATIONS

This Non-provisional application claims priority under 35 U.S.C. § 119(a) on Patent Application No. 2018-106084 filed in Japan on Jun. 1, 2018, the entire content of which is hereby incorporated by reference.

BACKGROUND

This disclosure relates to a display device and a method of controlling the same.

The display region of a color display device is generally composed of red (R) subpixels, green (G) subpixels, and blue (B) subpixels arrayed on the substrate of a display panel. Various arrangements of subpixels (pixel arrangements) have been proposed; for example, RGB stripe arrangement and delta-nabla arrangement (also simply referred to as delta arrangement) have been known (for example, refer to US 2017/0178554 A).

SUMMARY

An aspect of the disclosure is a display device including: a display panel including a plurality of panel pixel lines; and a controller configured to control the display panel. The plurality of panel pixel lines includes: first type of panel pixel lines each composed of a plurality of first type of panel pixels disposed in a first direction; and second type of panel pixel lines each composed of a plurality of second type of panel pixels disposed in the first direction. The first type of panel pixel lines and the second type of panel pixel lines are disposed alternately in a second direction perpendicular to the first direction. Each first type of panel pixel consists of a first red subpixel and a first blue subpixel disposed in the second direction and a first green subpixel disposed on the opposite side of the first red subpixel and the first blue subpixel in the opposite direction of the first direction and between the first red subpixel and the first blue subpixel in the second direction. Each second type of panel pixel consists of a second red subpixel and a second blue subpixel disposed in the second direction and a second green subpixel disposed on the opposite side of the second red subpixel and the second blue subpixel in the first direction and between the second red subpixel and the second blue subpixel in the second direction. The controller is configured to: receive image data for a picture frame; generate luminance data for the display panel from the image data; and modify the luminance data for the display panel by raising luminance values of a red subpixel and a blue subpixel adjacent along a first display line to a green subpixel located at an end of the first display line at outside of the first display line, the first display line being composed of a plurality of panel pixels consecutive in the first direction and assigned luminance values higher than 0.

It is to be understood that both the foregoing general description and the following detailed description are exemplary and explanatory and are not restrictive of this disclosure.

EMBODIMENTS

Hereinafter, embodiments of this disclosure will be described with reference to the accompanying drawings. It should be noted that the embodiments are merely examples to implement the features of this disclosure and are not to limit the technical scope of this disclosure. Elements common to the drawings are denoted by the same reference signs.

Configuration of Display Device

An overall configuration of a display device in this embodiment is described with reference to FIG. 1. The elements in the drawings may be exaggerated in size or shape for clear understanding of the description. In the following, an organic light-emitting diode (OLED) display device is described as an example of the display device; however, the features of this disclosure are applicable to any type of display device other than the OLED display device, such as the liquid crystal display device or the quantum dot display device.

Figure 1:
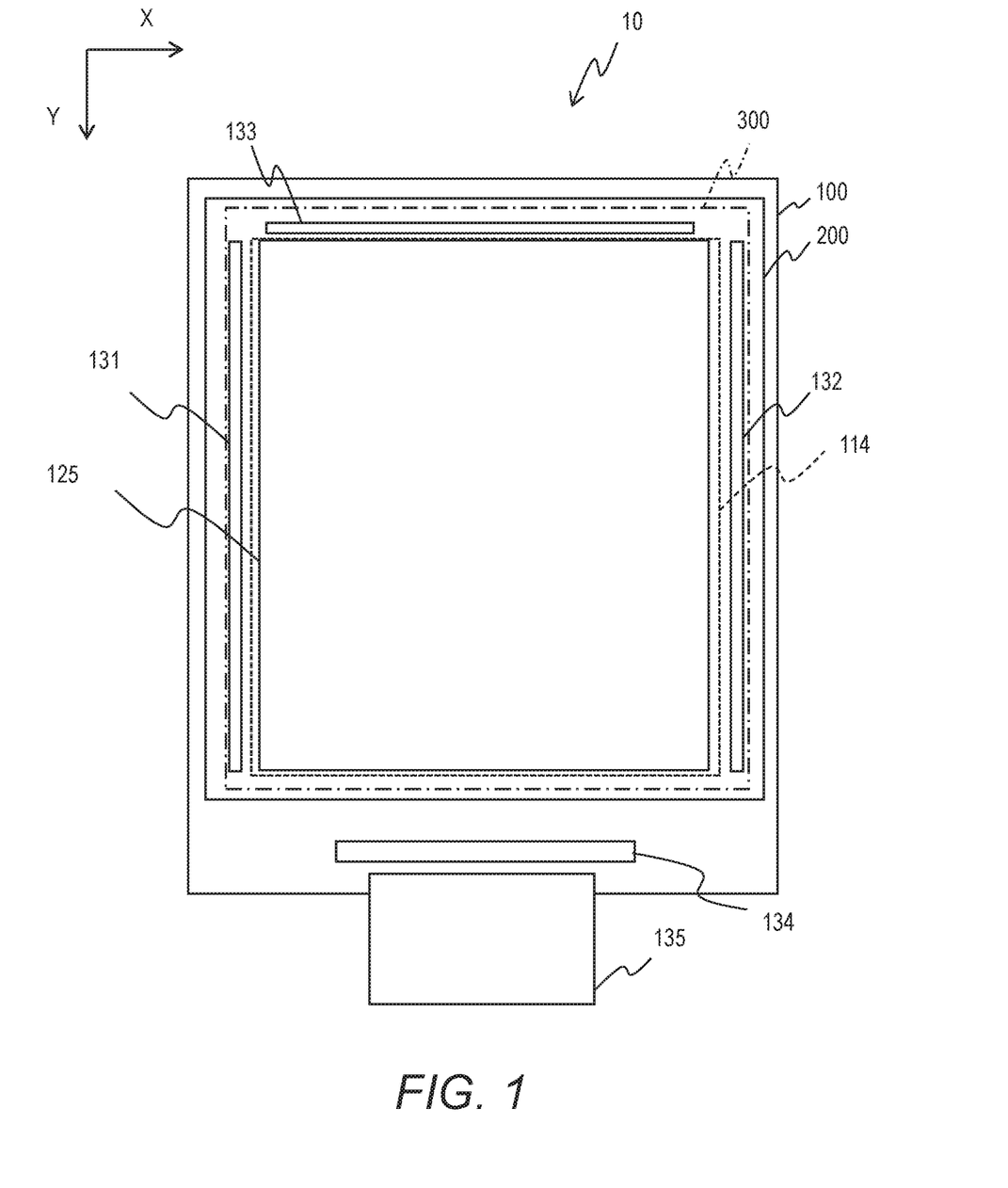
FIG. 1 schematically illustrates a configuration example of an OLED display device.

FIG. 1 schematically illustrates a configuration example of an OLED display device 10. The OLED display device 10 includes an OLED display panel and a control device. The OLED display panel includes a thin film transistor (TFT) substrate 100 on which OLED elements (light-emitting elements) are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, a protection circuit 133, and a driver IC 134 are provided. These are connected to the external devices via flexible printed circuits (FPC) 135. The driver IC 134, the scanning driver 131, the emission driver 132, and the protection circuit 133 are included in the control device.

The scanning driver 131 drives scanning lines on the TFT substrate 100. The emission driver 132 drives emission control lines to control the light emission periods of subpixels. The protection circuit 133 protects the elements from electrostatic discharge. The driver IC 134 is mounted with an anisotropic conductive film (ACF), for example.

The driver IC 134 provides power and timing signals (control signals) to the scanning driver 131 and the emission driver 132 and further, provides signals corresponding to picture data to the data lines. In other words, the driver IC 134 has a display control function. As will be described later, the driver IC 134 has a function to convert luminance data for the pixels of a picture frame into luminance data for the subpixels of the display panel.

In FIG. 1, the axis extending from the left to the right is referred to as X-axis and the axis extending from the top to the bottom is referred to as Y-axis. The scanning lines extend along the X-axis. The pixels or subpixels disposed in a line along the X-axis within the display region 125 are referred to as a pixel row or subpixel row; the pixels or subpixels disposed in a line along the Y-axis within the display region 125 are referred to as a pixel column or subpixel column.

Figure 2:
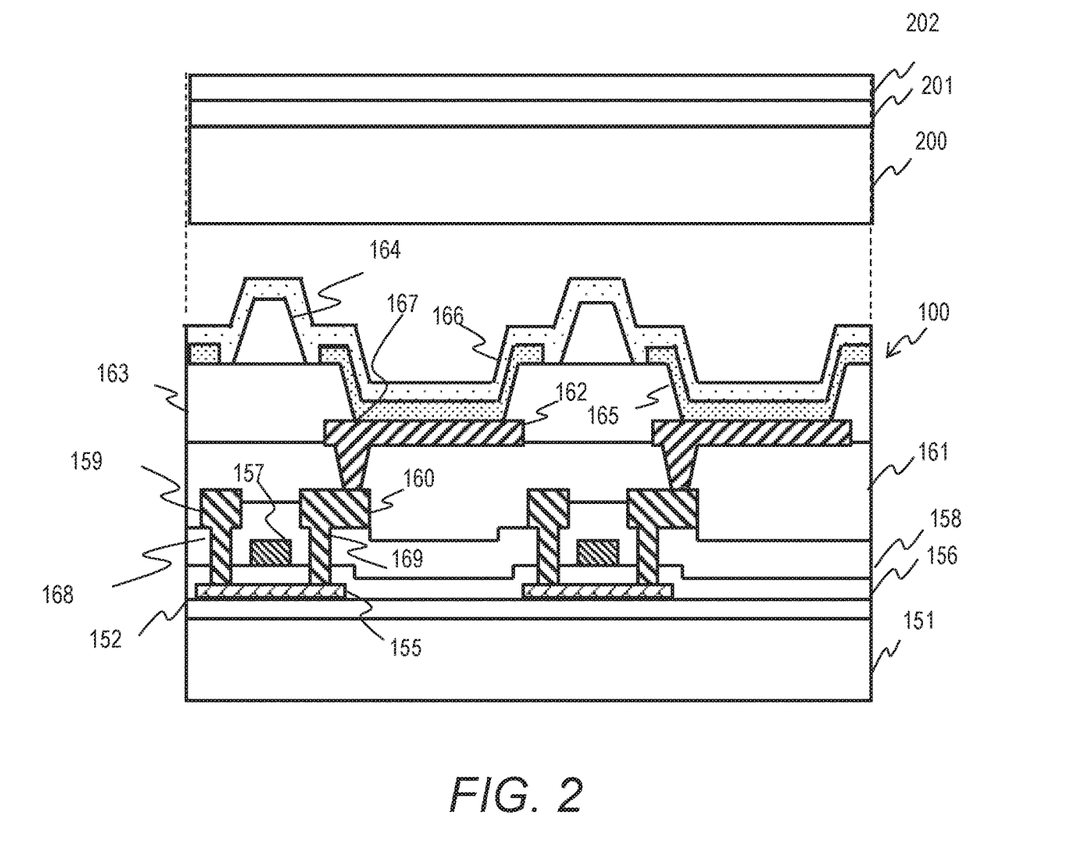
FIG. 2 schematically illustrates an example of a top-emission pixel structure.

Next, a detailed structure of the OLED display device 10 is described. FIG. 2 schematically illustrates a part of a cross-sectional structure of the OLED display device 10. The OLED display device 10 includes a TFT substrate 100 and an encapsulation structural unit opposed to the TFT substrate 100. An example of the encapsulation structural unit is a flexible or inflexible encapsulation substrate 200. The encapsulation structural unit can be a thin film encapsulation (TFE) structure, for example.

The TFT substrate 100 includes a plurality of lower electrodes (for example, anode electrodes 162), one upper electrode (for example, a cathode electrode 166), and a plurality of organic light-emitting films 165 disposed between an insulating substrate 151 and the encapsulation structural unit. The cathode electrode 166 is a transparent electrode that transmits the light from the organic light-emitting films 165 (also referred to as an organic light-emitting layer 165) toward the encapsulation structural unit.

An organic light-emitting film 165 is disposed between the cathode electrode 166 and an anode electrode 162. The plurality of anode electrodes 162 are disposed on the same plane (for example, on a planarization film 161) and an organic light-emitting film 165 is disposed on an anode electrode 162.

The OLED display device 10 further includes a plurality of spacers 164 standing toward the encapsulation structural unit and a plurality of circuits each including a plurality of switches. Each of the plurality of circuits is formed between the insulating substrate 151 and an anode electrode 162 and controls the electric current to be supplied to the anode electrode 162.

FIG. 2 illustrates an example of a top-emission pixel structure. The top-emission pixel structure is configured in such a manner that the cathode electrode 166 common to a plurality of pixels is provided on the light emission side (the upper side of the drawing). The cathode electrode 166 has a shape that fully covers the entire display region 125. The features of this disclosure are also applicable to an OLED display device having a bottom-emission pixel structure. The bottom-emission pixel structure has a transparent anode electrode and a reflective cathode electrode to emit light to the external through the TFT substrate 100.

Hereinafter, the OLED display device 10 is described in more detail. The TFT substrate 100 includes subpixels arrayed within the display region 125 and lines provided in the wiring region surrounding the display region 125. The lines connect the pixel circuits with the circuits 131, 132, and 134 provided in the wiring region.

The display region 125 in this embodiment is composed of subpixels arrayed in delta-nabla arrangement. The details of the delta-nabla arrangement will be described later. Hereinafter, the OLED display panel may be referred to as delta-nabla panel. A subpixel is a light emitting region for displaying one of the colors of red (R), green (G), and blue (B). The example described in the following displays an image with the combination of these three colors.

The light emitting region is included in an OLED element which is composed of an anode electrode as a lower electrode, an organic light-emitting film, and a cathode electrode as an upper electrode. A plurality of OLED elements are formed of one cathode electrode 166, a plurality of anode electrodes 162, and a plurality of organic light-emitting films 165.

The insulating substrate 151 is made of glass or resin, for example, and is flexible or inflexible. In the following description, the side closer to the insulating substrate 151 is defined as lower side and the side farther from the insulating substrate 151 is defined as upper side. Gate electrodes 157 are provided on a gate insulating film 156. An interlayer insulating film 158 is provided over the gate electrodes 157.

Within the display region 125, source electrodes 159 and drain electrodes 160 are provided above the interlayer insulating film 158. The source electrodes 159 and the drain electrodes 160 are formed of a metal having a high melting point or an alloy of such a metal. Each source electrode 159 and each drain electrode 160 are connected with a channel 155 on an insulating layer 152 through contacts 168 and 169 provided in contact holes of the interlayer insulating film 158.

Over the source electrodes 159 and the drain electrodes 160, an insulative planarization film 161 is provided. Above the insulative planarization film 161, anode electrodes 162 are provided. Each anode electrode 162 is connected with a drain electrode 160 through a contact provided in a contact hole in the planarization film 161. The pixel circuits (TFTs) are formed below the anode electrodes 162.

Above the anode electrodes 162, an insulative pixel defining layer (PDL) 163 is provided to separate OLED elements. An OLED element is composed of an anode electrode 162, an organic light-emitting film 165, and the cathode electrode 166 (a part thereof) laminated together. The light-emitting region of an OLED element is formed in an opening 167 of the pixel defining layer 163.

Each insulative spacer 164 is provided on the pixel defining layer 163 and between anode electrodes 162. The top face of the spacer 164 is located higher than the top face of the pixel defining layer 163 or closer to the encapsulation substrate 200 and maintains the space between the OLED elements and the encapsulation substrate 200 by supporting the encapsulation substrate 200 when the encapsulation substrate 200 is deformed.

Above each anode electrode 162, an organic light-emitting film 165 is provided. The organic light-emitting film 165 is in contact with the pixel defining layer 163 in the opening 167 of the pixel defining layer 163 and its periphery. A cathode electrode 166 is provided over the organic light-emitting film 165. The cathode electrode 166 is a transparent electrode. The cathode electrode 166 transmits all or part of the visible light from the organic light-emitting film 165.

The laminated film of the anode electrode 162, the organic light-emitting film 165, and the cathode electrode 166 formed in an opening 167 of the pixel defining layer 163 corresponds to an OLED element. Electric current flows only within the opening 167 of the pixel defining layer 163 and accordingly, the region of the organic light-emitting film 165 exposed in the opening 167 is the light emitting region (subpixel) of the OLED element. The cathode electrode 166 is common to the anode electrodes 162 and the organic light-emitting films 165 (OLED elements) that are formed separately. A not-shown cap layer may be provided over the cathode electrode 166.

The encapsulation substrate 200 is a transparent insulating substrate, which can be made of glass. A λ/4 plate 201 and a polarizing plate 202 are provided over the light emission surface (top face) of the encapsulation substrate 200 to prevent reflection of light entering from the external.

Configuration of Driver IC

Figure 3A:
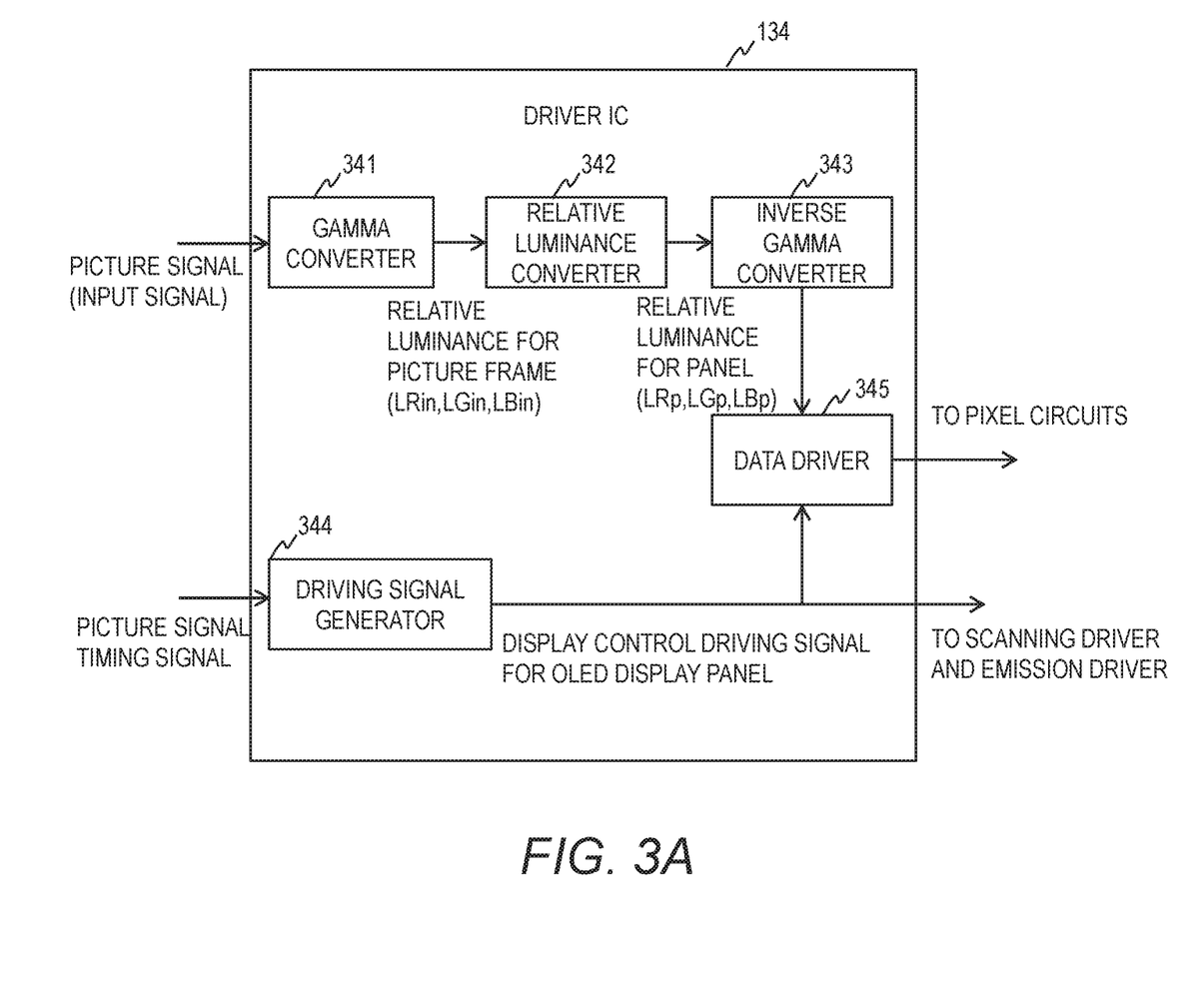
FIG. 3A illustrates logical elements of a driver IC.

FIG. 3A illustrates logical elements of the driver IC 134. The driver IC 134 includes a gamma converter 341, a relative luminance converter 342, an inverse gamma converter 343, a driving signal generator 344, and a data driver 345.

The driver IC 134 receives a picture signal and a picture signal timing signal from a not-shown main controller. The picture signal includes data (signal) for successive picture frames. The gamma converter 341 converts the RGB scale values (signal) included in the input picture signal to RGB relative luminance values. More specifically, the gamma converter 341 converts the R scale values, the G scale values, and the B scale values for individual pixels of each picture frame into R relative luminance values, G relative luminance values, and B relative luminance values. The relative luminance values are also referred to simply as luminance values. The relative luminance values for a pixel are luminance values normalized in the picture frame.

The relative luminance converter 342 converts the R, G, B relative luminance values for individual pixels of a picture frame into R, G, B relative luminance values for subpixels of the OLED display panel. The relative luminance value for a subpixel is a luminance value for the subpixel normalized in the OLED display panel.

As will be described later, the relative luminance converter 342 adjusts the relative luminance values of specific one or more subpixels to make a green subpixel at an end of a display line less conspicuous. The calculation to adjust the final luminance values for the specific subpixels can be performed by any function unit different from the relative luminance converter 342.

The number of pixels of image data to be displayed is not always equal to the number of pixels of the display panel; the apparent resolution can be increased by rendering. In that case, the relative luminance converter 342 adjusts the relative luminance values of the subpixels associated with individual subpixels of the OLED display panel by the rendering.

The inverse gamma converter 343 converts the relative luminance values for the R subpixels, G subpixels, and B subpixels calculated by the relative luminance converter 342 to scale values for the R subpixels, G subpixels, and B subpixels. The data driver 345 sends a driving signal in accordance with the scale values for the R subpixels, G subpixels, and B subpixels to the pixel circuits.

The driving signal generator 344 converts an input picture signal timing signal to a display control driving signal for the OLED display panel. The picture signal timing signal includes a dot clock (pixel clock) for determining the data transfer rate, a horizontal synchronization signal, a vertical synchronization signal, and a data enable signal.

The driving signal generator 344 generates control signals for the data driver 345, the scanning driver 131, and the emission driver 132 of the delta-nabla panel (or the driving signal for the panel) from the dot clock of the picture signal timing signal, the data enable signal, the vertical synchronization signal, and the horizontal synchronization signal input thereto and outputs the generated signals to the drivers.

Pixel Circuit

Figure 3B:
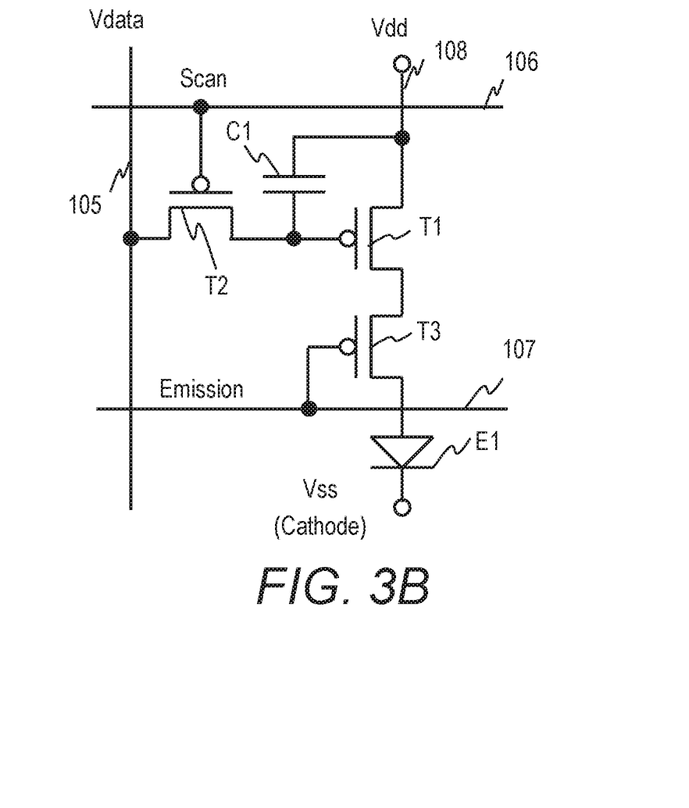
FIG. 3B illustrates an example of a pixel circuit.

A plurality of pixel circuits are formed on the substrate 100 to control the current to be supplied to the anode electrodes of subpixels. FIG. 3B illustrates a configuration example of a pixel circuit. Each pixel circuit includes a first transistor T1, a second transistor T2, a third transistor T3, and a storage capacitor C1. The pixel circuit controls light emission of an OLED element E1 of a subpixel. The transistors are thin film transistors (TFTs). Hereinafter, the first transistor T1 to the third transistor T3 are abbreviated as transistor T1 to transistor T3.

The transistor T2 is a switch for selecting the subpixel. The transistor T2 is a p-channel TFT and its gate terminal is connected with a scanning line 106. The drain terminal is connected with a data line 105. The source terminal is connected with the gate terminal of the transistor T1.

The transistor T1 is a transistor (driving TFT) for driving the OLED element E1. The transistor T1 is a p-channel TFT and its gate terminal is connected with the source terminal of the transistor T2. The source terminal of the transistor T1 is connected with a power line (Vdd) 108. The drain terminal is connected with the source terminal of the transistor T3. The storage capacitor C1 is provided between the gate terminal and the source terminal of the transistor T1.

The transistor T3 is a switch for controlling the supply/stop of the driving current to the OLED element E1. The transistor T3 is a p-channel TFT and its gate terminal is connected with an emission control line 107. The source terminal of the transistor T3 is connected with the drain terminal of the transistor T1. The drain terminal is connected with the OLED element E1.

Next, operation of the pixel circuit is described. The scanning driver 131 outputs a selection pulse to the scanning line 106 to turn the transistor T2 ON. The data voltage supplied from the driver IC 134 through the data line 105 is stored to the storage capacitor C1. The storage capacitor C1 holds the stored voltage during the period of one frame. The conductance of the transistor T1 changes in an analog manner in accordance with the stored voltage, so that the transistor T1 supplies a forward bias current corresponding to a light emission level to the OLED element E1.

The transistor T3 is located on the supply path of the driving current. The emission driver 132 outputs a control signal to the emission control line 107 to control ON/OFF of the transistor T3. When the transistor T3 is ON, the driving current is supplied to the OLED element E1. When the transistor T3 is OFF, this supply is stopped. The lighting period (duty ratio) in the period of one frame can be controlled by controlling ON/OFF of the transistor T3.

Figure 3C:
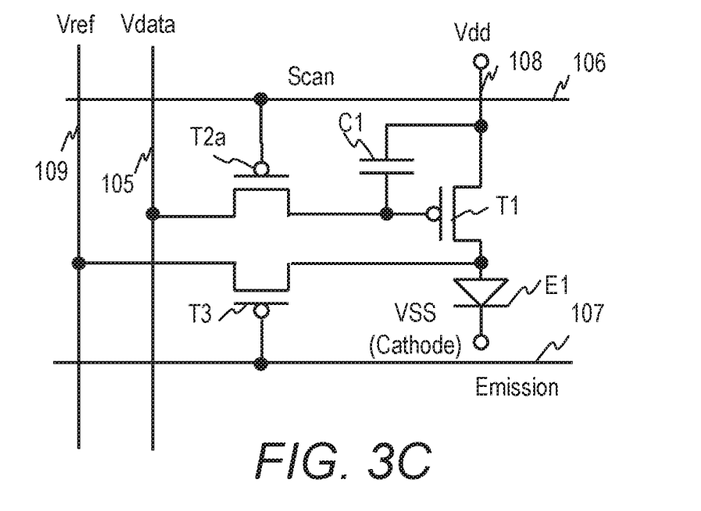
FIG. 3C illustrates another example of a pixel circuit.

FIG. 3C illustrates another configuration example of a pixel circuit. The differences from the pixel circuit in FIG. 3B are the transistor T2a and the transistor T3. The transistor T2a is a switch having the same function as the transistor T2 in FIG. 3B, or a switch for selecting the subpixel.

The transistor T3 can be used for various purposes. For example, the transistor T3 can be used to reset the anode electrode of the OLED element E1 once to a sufficiently low voltage that is lower than the black signal level to prevent crosstalk caused by leak current between OLED elements E1.

The transistor T3 can also be used to measure a characteristic of the transistor T1. For example, the voltage-current characteristic of the transistor T1 can be accurately measured by measuring the current flowing from the power line (Vdd) 108 to the reference voltage supply line (Vref) 109 under the bias conditions selected so that the transistor T1 will operate in the saturated region and the switching transistor T3 will operate in the linear region. If the differences in voltage-current characteristic among the transistors T1 for individual sub-pixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 109 when the transistor T1 is off and the transistor T3 is operating in the linear region. In the case where the OLED element E1 is deteriorated because of long-term use, for example, if the deterioration is compensated for by generating a data signal at an external circuit, the display device can have a long life spun.

The circuit configurations in FIGS. 3B and 3C are examples; the pixel circuit may have a different circuit configuration. Although the pixel circuits in FIGS. 3B and 3C employ p-channel TFTs, the pixel circuit may employ n-channel TFTs.

Pixel Disposition in Delta-Nabla Panel

Figure 4:
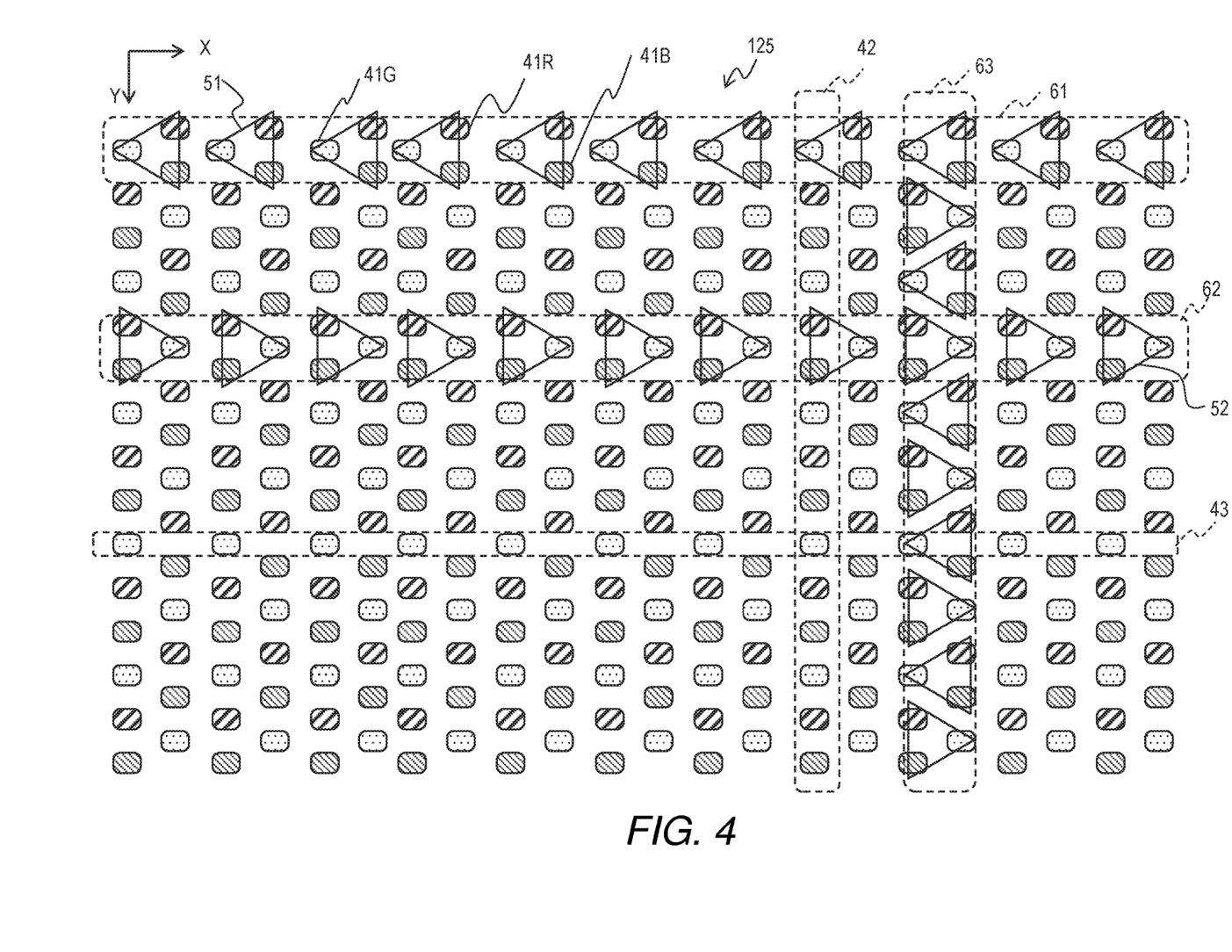
FIG. 4 illustrates a pixel disposition in a delta-nabla panel.

FIG. 4 illustrates a pixel disposition in a delta-nabla panel. FIG. 4 schematically illustrates a partial region of the display region 125. The display region 125 is composed of a plurality of red subpixels 41R, a plurality of green subpixels 41G, and a plurality of blue subpixels 41B disposed in a plane. In FIG. 4, one of the red subpixels, one of the green subpixels, and one of the blue subpixels are provided with reference signs by way of example. The rounded rectangles identically hatched in FIG. 4 represent subpixels of the same color. Although the subpixels in FIG. 4 have rectangular shapes, subpixels may have desired shapes, such as hexagonal or octagonal shapes.

The display region 125 includes a plurality of subpixel columns 42 disposed side by side in the X-direction (an example of the first direction). In FIG. 4, one of the subpixel columns is provided with a reference sign 42 by way of example. Each subpixel column 42 is composed of subpixels disposed one above another in the Y-direction (an example of the second direction) in FIG. 4. The X-direction is a direction extending from the left to the right of FIG. 4 (the direction along the X-axis) and the Y-direction is a direction extending from the top to the bottom of FIG. 4 (the direction along the Y-axis). The X-direction and the Y-direction are perpendicular to each other in the plane where the subpixels are disposed.

Each subpixel column 42 is composed of red subpixels 41R, green subpixels 41G, and blue subpixels 41B disposed in turn at a predetermined pitch. In the example of FIG. 4, subpixels are cyclically disposed in the order of a red subpixel 41R, a blue subpixel 41B, and a green subpixel 41G. Two subpixel columns 42 adjacent to each other are located differently in the Y-direction; each subpixel of one subpixel column 42 is located between subpixels of the other two colors in the other adjacent subpixel column 42 in the Y-direction.

In the example of FIG. 4, each subpixel column is shifted by a half pitch with respect to the adjacent subpixel columns. One pitch is a distance between subpixels of the same color in the Y-direction. For example, a green subpixel 41G is located at the middle between a red subpixel 41R and a blue subpixel 41B of an adjacent subpixel column 42 in the Y-direction.

The display region 125 includes a plurality of subpixel rows 43 disposed one above another in the Y-direction. In FIG. 4, one of the green subpixel rows is provided with a reference sign 43 by way of example. Each subpixel row 43 is composed of subpixels disposed side by side in the X-direction at a predetermined pitch. In the example of FIG. 4, each subpixel row 43 is composed of subpixels of the same color. Each subpixel row 43 is sandwiched by subpixel rows of the other two colors along the Y-axis.

In the X-direction, each subpixel of a subpixel row 43 is located between subpixels adjacent to each other in an adjacent subpixel row 43. In the example of FIG. 4, each subpixel row is shifted by a half pitch with respect to the adjacent subpixel rows. One pitch is a distance between subpixels adjacent to each other in a subpixel row 43. A subpixel is located at the middle between two subpixels adjacent to each other in an adjacent subpixel row 43 in the X-direction.

In this embodiment, a subpixel line extending along the X-axis is referred to as subpixel row and a subpixel line extending along the Y-axis is referred to as subpixel column for descriptive purposes; however, the orientations of the subpixel rows and the subpixel columns are not limited to these examples.

The display region 125 includes two types of panel pixels disposed in a matrix. The two types of panel pixels are first type of panel pixels 51 and second type of panel pixels 52. Hereinafter, the pixels of the display panel are referred to as panel pixels or simply, as pixels; the pixels in a picture frame are referred to as frame pixels or simply, as pixels.

In FIG. 4, only one of the first type of panel pixels is provided with a reference sign 51 and only one of the second type of panel pixels is provided with a reference sign 52 by way of example. Either the first type of panel pixels or the second type of panel pixels are delta pixels and the remaining are nabla pixels in the delta-nabla arrangement.

In FIG. 4, some of the first type of panel pixels 51 are indicated by triangles oriented so that one of the vertices is located on the left and the other two vertices are located on the right. In addition, some of the second type of panel pixels 52 are indicated by triangles oriented so that one of the vertices is located on the right and the other two vertices are located on the left. The right in FIG. 4 is on the side of the X-direction and the left in FIG. 4 is on the opposite side of the X-direction. The panel pixels 51 can be referred to as second type of panel pixels and the panel pixels 52 can be referred to as first type of panel pixels.

A first type of panel pixel 51 and a second type of panel pixel 52 each consist of one green subpixel 41G, and the red subpixel 41R and the blue subpixel 41B adjacent to (closest to) the green subpixel 41G in a subpixel column 42 adjacent to the subpixel 41G.

In a first type of panel pixel 51, the red subpixel 41R and the blue subpixel 41B are disposed consecutively in the same subpixel column 42. The subpixel column 42 including the green subpixel 41G is adjacent to the subpixel column 42 including the red subpixel 41R and the blue subpixel 41B on the opposite side of the X-direction, or on the left in FIG. 4. The green subpixel 41G is located between, more specifically, at the middle between the red subpixel 41R and the blue subpixel 41B along the Y-axis.

In a second type of pixel 52, the red subpixel 41R and the blue subpixel 41B are disposed consecutively in the same subpixel column 42. The subpixel column 42 including the green subpixel 41G is adjacent to the subpixel column 42 including the red subpixel 41R and the blue subpixel 41B on the side of the X-direction, or on the right in FIG. 4. The green subpixel 41G is located between, more specifically, at the middle between the red subpixel 41R and the blue subpixel 41B along the Y-axis.

The display region 125 includes a plurality of panel pixel rows (pixel lines extending along the X-axis) extending along the X-axis and disposed one above another along the Y-axis. The plurality of panel pixel rows include two types of panel pixel rows: first type of panel pixel rows 61 and second type of panel pixel rows 62. In FIG. 4, one of the first type of panel pixel rows is provided with a reference sign 61 by way of example. Further, one of the second type of panel pixel rows is provided with a reference sign 62 by way of example.

A first type of panel pixel row 61 is composed of first type of panel pixels 51 disposed side by side in the X-direction. A second type of panel pixel row 62 is composed of second type of panel pixels 52 disposed side by side in the X-direction. In the display region 125, first type of panel pixel rows 61 and second type of panel pixel rows 62 are disposed alternately in the Y-direction.

The display region 125 includes a plurality of panel pixel columns (pixel lines extending along the Y-axis) 63 extending along the Y-axis and disposed side by side along the X-axis. In FIG. 4, one of the panel pixel columns is provided with a reference sign 63 by way of example. Each panel pixel column 63 is composed of first type of panel pixels 51 and second type of panel pixels 52 disposed alternately along the Y-axis at a predetermined pitch.

Modification of Luminance Data for Subpixels

Hereinafter, a method of modifying the luminance values of subpixels is described. The driver IC 134 modifies the luminance value of a specific subpixel in the luminance data for the display panel converted from the image data for a picture frame. More specifically, the driver IC 134 modifies the luminance data by raising the luminance values of the red and blue subpixels adjacent along the X-axis to the green subpixel at an end of a display line extending along the X-axis in the display region 125. For example, the luminance values of unlighted red and blue subpixels are raised to values higher than 0. This operation diminishes the change in color from the desired color to be seen at the end of the display line.

As described above, the driver IC 134 generates luminance data for the display panel from the image data for a picture frame. The luminance data specifies the luminance values (relative luminance values or absolute luminance values) for individual subpixels of the display panel. The driver IC 134 modifies the luminance data by adding a red subpixel and a blue subpixel adjacent along the X-axis to a line-end green subpixel to the display line extending along the X-axis.

A display line is composed of consecutive panel pixels disposed in one direction and assigned luminance values higher than 0. The luminance value of a panel pixel is based on the luminance values of its constituent subpixels. When the luminance values of one or more constituent subpixels are higher than 0, the luminance value of the panel pixel is higher than 0. The luminance value of the panel pixel adjacent along a display line to the display line at outside of the display line is 0 or smaller than the luminance value of the line-end panel pixel by a specific value or more. The specific value can be a predetermined constant or a predetermined rate of the luminance value of the line-end panel pixel.

The luminance value of a panel pixel can be calculated from the luminance values of its three constituent subpixels by a predetermined method. The luminance value of the panel pixel adjacent along a display line to the line-end panel pixel can be fixed at 0. As understood from this description, the end of a display line is determined based on the luminance value of the panel pixel adjacent along the display line.

Figure 5A:
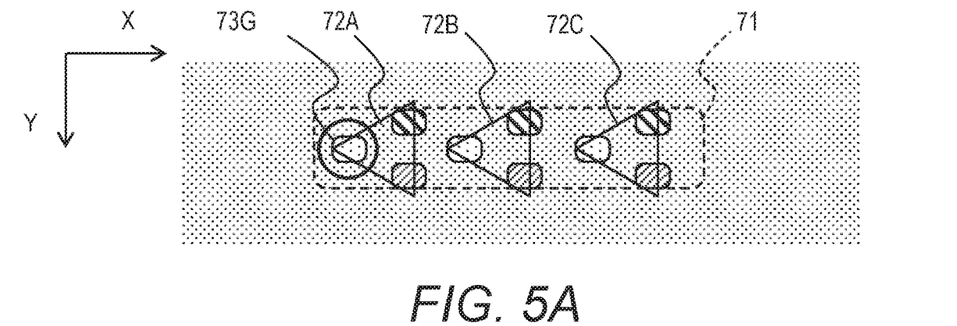
FIG. 5A illustrates an example of a white display line extending in the X-axis.

Herein, display lines composed of white panel pixels and extending along the X-axis are described by way of example. In the following, examples where unlighted red subpixel and blue subpixel are turned on are described. FIG. 5A illustrates an example 71 of a white display line extending along the X-axis. The display line 71 consists of three panel pixels 72A, 72B, and 72C. Each of the panel pixels 72A, 72B, and 73C consists of a lighted red subpixel, a lighted blue subpixel, and a lighted green subpixel.

The display line 71 extending along the X-axis is included in a first type of panel pixel row 61. The display line 71 has two line ends. At one of the line ends (the left end in FIG. 5A), a green subpixel 73G is located. At the other line end (the right end in FIG. 5A), a red subpixel and a blue subpixel are located.

The panel pixel adjacent to the left of the panel pixel 72A at the left end of the display line 71 is assigned a luminance value of 0. The panel pixel adjacent to the right of the panel pixel 72C at the right end of the display line 71 is assigned a luminance value of 0. Further, the panel pixels adjacent to the constituent panel pixels 72A, 72B, and 72C of the display line 71 at outside of the display line 71 are assigned luminance values of 0 (unlighted). The display line 71 is surrounded by unlighted panel pixels.

Figure 5B:
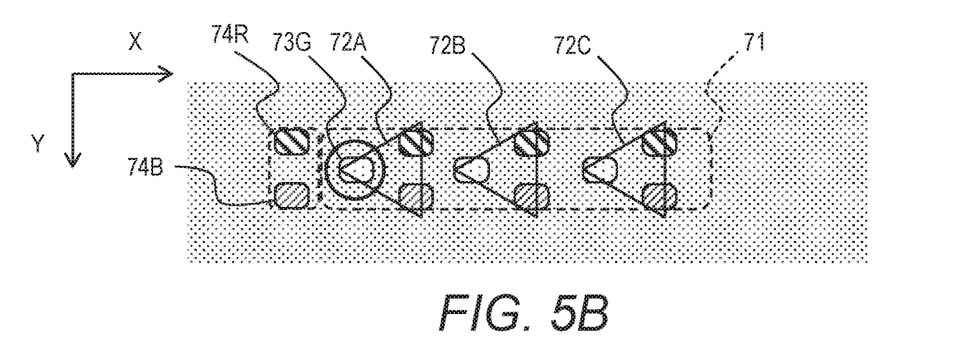
FIG. 5B illustrates the display line and a red subpixel and a blue subpixel added to the display line.

As described above, the red subpixel and the blue subpixel adjacent to the left of the line-end green subpixel 73G of the display line 71 are added to the display line 71. FIG. 5B illustrates the display line 71 and a red subpixel 74R and a blue subpixel 74B added to the display line 71.

The visibility of green is the highest among the three colors of red, blue, and green. For this reason, the green subpixel 73G projecting from the display line 71 tends to be conspicuous although green subpixels sandwiched between lighted red and blue subpixel pairs like the green subpixels of the panel pixels 72B and 72C are appropriately mixed in color with the subpixels of the other colors. The user tends to perceive the green color of the green subpixel 73G, instead of white. Turning on the red subpixel 74R and the blue subpixel 74B adjacent to the green subpixel 73G prevents the user from seeing a green dot at the left end of the display line 71.

Figure 6A:
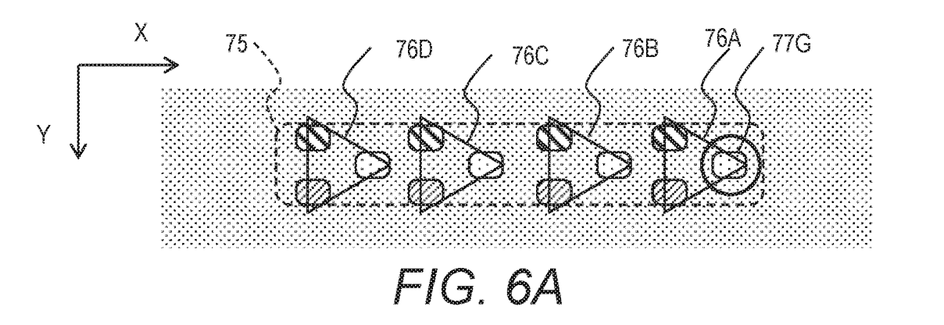
FIG. 6A illustrates an example of a white display line extending in the X-axis.

FIG. 6A illustrates an example 75 of a white display line extending along the X-axis. The display line 75 consists of four panel pixels 76A, 76B, 76C, and 76D. Each of the panel pixels 76A, 76B, 76C, and 76D consists of a lighted red subpixel, a lighted blue subpixel, and a lighted green subpixel.

The display line 75 extending along the X-axis is included in a second type of panel pixel row 62. The display line 75 has two line ends. At one of the line ends (the right end in FIG. 6A), a green subpixel 77G is located. At the other line end (the left end in FIG. 6A), a red subpixel and a blue subpixel are located.

The panel pixel adjacent to the right of the panel pixel 76A at the right end of the display line 75 is assigned a luminance value of 0. The panel pixel adjacent to the left of the panel pixel 76D at the left end of the display line 75 is assigned a luminance value of 0. Further, the panel pixels adjacent to the constituent panel pixels 76A, 76B, 76C, and 76D of the display line 75 at outside of the display line 75 are assigned luminance values of 0 (unlighted). The display line 75 is surrounded by unlighted panel pixels.

Figure 6B:
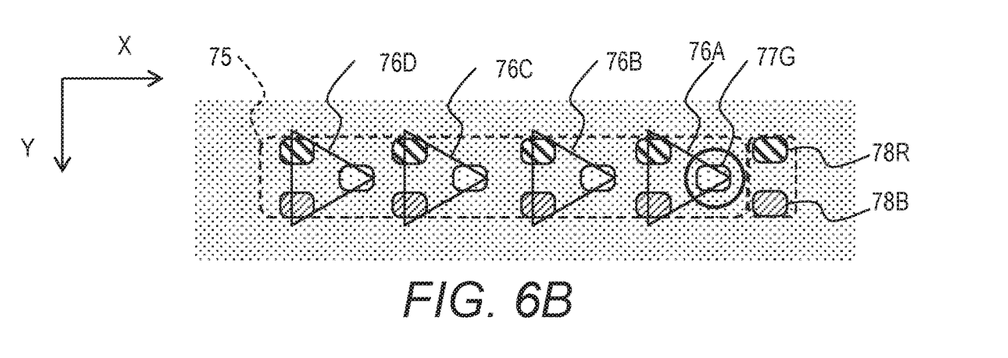
FIG. 6B illustrates the display line and a red subpixel and a blue subpixel added to the display line.

As described above, the red subpixel and the blue subpixel adjacent to the right of the line-end green subpixel 77G of the display line 75 are added to the display line 75. FIG. 6B illustrates the display line 75 and a red subpixel 78R and a blue subpixel 78B added to the display line 75. Turning on the red subpixel 78R and the blue subpixel 78B adjacent to the green subpixel 77G prevents the user from seeing a green dot at the right end of the display line 75.

Figure 7A:
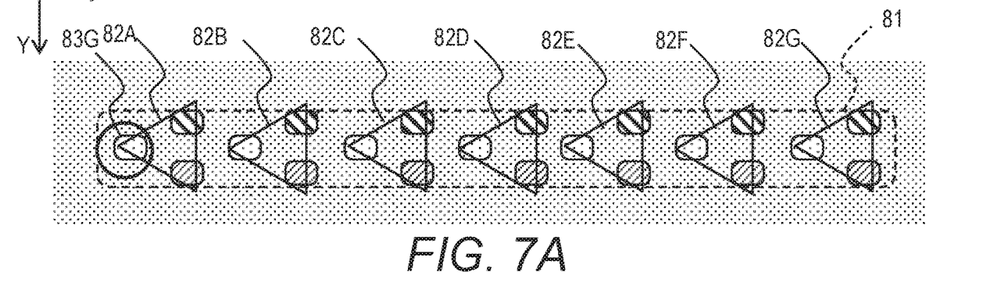
FIG. 7A illustrates an example of a white display line extending in the X-axis.

FIG. 7A illustrates an example 81 of a white display line extending along the X-axis. The display line 81 consists of seven panel pixels 82A to 82G. Each of the panel pixels 82A to 82G consists of a lighted red subpixel, a lighted blue subpixel, and a lighted green subpixel.

The display line 81 extending along the X-axis is included in a first type of panel pixel row 61. The display line 81 has two line ends. At one of the line ends (the left end in FIG. 7A), a green subpixel 83G is located. At the other line end (the right end in FIG. 7A), a red subpixel and a blue subpixel are located.

The panel pixel adjacent to the left of the panel pixel 82A at the left end of the display line 81 is assigned a luminance value of 0. The panel pixel adjacent to the right of the panel pixel 82G at the right end of the display line 81 is assigned a luminance value of 0. Further, the panel pixels adjacent to the constituent panel pixels 82A to 82G of the display line 81 at outside of the display line 81 are assigned luminance values of 0 (unlighted). The display line 81 is surrounded by unlighted panel pixels.

Figure 7B:
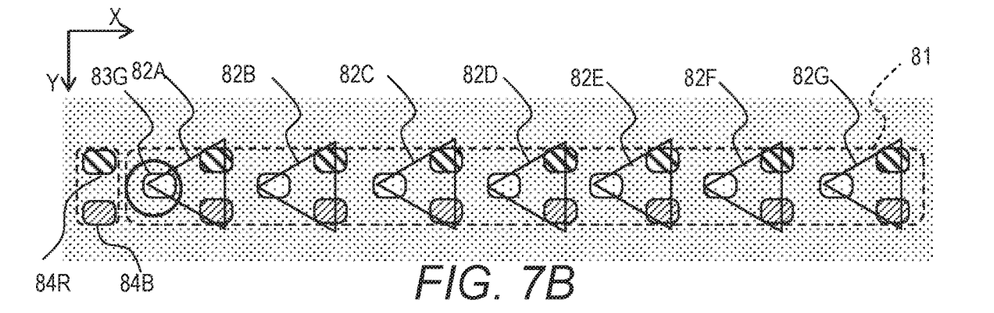
FIG. 7B illustrates the display line and a red subpixel and a blue subpixel added to the display line.

As described above, the red subpixel and the blue subpixel adjacent to the left of the line-end green subpixel 83G of the display line 81 are added to the display line 81. FIG. 7B illustrates the display line 81 and a red subpixel 84R and a blue subpixel 84B added to the display line 81. Turning on the red subpixel 84R and the blue subpixel 84B adjacent to the green subpixel 83G prevents the user from seeing a green dot at the left end of the display line 81.

Figure 8A:
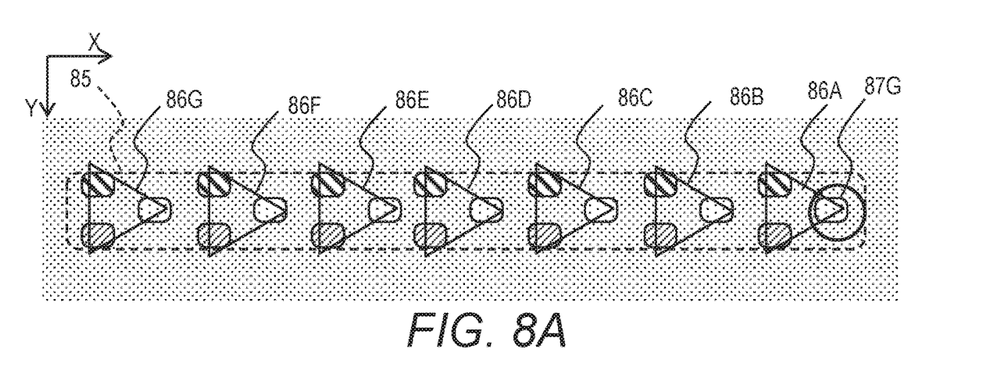
FIG. 8A illustrates an example of a white display line extending in the X-axis.

FIG. 8A illustrates an example 85 of a white display line extending along the X-axis. The display line 85 consists of seven panel pixels 86A to 86G. Each of the panel pixels 86A to 86G consists of a lighted red subpixel, a lighted blue subpixel, and a lighted green subpixel.

The display line 85 extending along the X-axis is included in a second type of panel pixel row 62. The display line 85 has two line ends. At one of the line ends (the right end in FIG. 8A), a green subpixel 87G is located. At the other line end (the left end in FIG. 8A), a red subpixel and a blue subpixel are located.

The panel pixel adjacent to the right of the panel pixel 86A at the right end of the display line 85 is assigned a luminance value of 0. The panel pixel adjacent to the left of the panel pixel 86G at the left end of the display line 85 is assigned a luminance value of 0. Further, the panel pixels adjacent to the constituent panel pixels 86A to 86G of the display line 85 at outside of the display line 85 are assigned luminance values of 0 (unlighted). The display line 85 is surrounded by unlighted panel pixels.

Figure 8B:
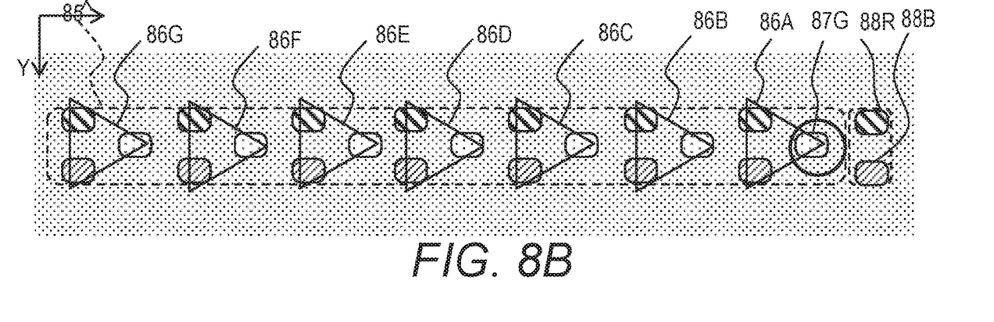
FIG. 8B illustrates the display line and a red subpixel and a blue subpixel added to the display line.

As described above, the red subpixel and the blue subpixel adjacent to the right of the line-end green subpixel 87G of the display line 85 are added to the display line 85. FIG. 8B illustrates the display line 85 and a red subpixel 88R and a blue subpixel 88B added to the display line 85. Turning on the red subpixel 88R and the blue subpixel 88B adjacent to the green subpixel 87G prevents the user from seeing a green dot at the right end of the display line 85.

As described with reference to FIGS. 5A to 8B, a display line extending along the X-axis has two subpixels at one end and one subpixel at the other end. Specifically, the two subpixels at one line end are a red subpixel and a blue subpixel and the one subpixel at the other line end is a green subpixel.

As described with reference to FIGS. 5A and 7A, a display line composed of lighted panel pixels in a first type of panel pixel row 61 has a green subpixel at the left line end. As described with reference to FIGS. 6A and 8A, a display line composed of lighted panel pixels in a second type of panel pixel row 62 has a green subpixel at the right line end.

In the examples described with reference to FIGS. 5A to 8B, the panel pixels adjacent along a display line to the display line are assigned a luminance value of 0. In one example, the panel pixel adjacent to the left of the left-end panel pixel 72A of the display line 71 is assigned a luminance value of 0. Further, the panel pixel adjacent to the right of the right-end panel pixel 72C is assigned a luminance value of 0. In another example, the panel pixels adjacent along a display line to the display line can be assigned a luminance value higher than 0 but smaller than the value for the line-end panel pixel of the display line by a predetermined value or more.

In other words, the luminance value of the panel pixel adjacent to the left end of a display line is 0 (unlighted state) or no adjacent panel pixel, and the luminance value of the panel pixel adjacent to the right end of a display line is 0 (turned off state) or no adjacent panel pixel. Taking an example of the display line 71, the luminance value of the panel pixel adjacent to the left of the left-end panel pixel 72A is 0 and the luminance value of the panel pixel adjacent to the right of the right-end panel pixel 72C is 0.

The driver IC 134 identifies a display line including a green subpixel lighted at a line end and reassigns luminance values higher than 0 to the red subpixel and the blue subpixel adjacent along the X-axis to the green subpixel at outside of the display line.

In the examples described with reference to FIGS. 5A to 8B, the display line is surrounded by black (unlighted) panel pixels. The driver IC 134 may select a display line satisfying specific conditions and add a (lighted) red subpixel and a (lighted) blue subpixel to the selected display line. Alternatively, the driver IC 134 may add a red subpixel and a blue subpixel to every display line.

The driver IC 134 may select a display line such that all panel pixels adjacent along the X-axis or the Y-axis to the panel pixel including a line-end green subpixel at outside of the display line are assigned luminance values of 0 and add a red subpixel and a blue subpixel to the selected display line. The driver IC 134 may select a display line surrounded by black (unlighted) panel pixels, like the examples described with reference to FIGS. 5A to 8B.

Unlike the examples of FIGS. 5A to 8B, the driver IC 134 may select a display line composed of panel pixels to be lighted in one or more colors different from white and add a red subpixel and a blue subpixel to the selected display line. The driver IC 134 may select a display line to be displayed in one or more colors (a mixed color) including a component of green and add a red subpixel and a blue subpixel to the selected display line.

Unlike the examples of FIGS. 5A to 8B, when panel pixels adjacent to a display line are lighted dark, or when the luminance values of the adjacent panel pixels are higher than 0 but lower than the luminance value of the line-end panel pixel of a display line by a predetermined value or more, the driver IC 134 raises the luminance values of the red subpixel and the blue subpixel of the adjacent lighted panel pixel.

In general, the human eyes have a characteristic to perceive a color having high visibility as the center of brightness and mix the peripheral colors having lower visibility to the center of brightness. Accordingly, it is preferable that the colors be mixed when a green subpixel is located at the proximity of the center of the panel pixel. However, when the green subpixel is located at an end of a display line, there are no colors to be mixed around the green subpixel, so that the green subpixel becomes a conspicuous green dot. The green subpixel can be well mixed in color when subpixels of the other colors are located outside to sandwich the green subpixel as described above.

Lighting the red subpixel and the blue subpixel adjacent to a display line extending along the X-axis as described above enables a fine pattern to be displayed more precisely. For example, a hook of a character in Ming font can be displayed sharply.

When a red subpixel and a blue subpixel are added as described above, the total luminance of red and blue in the overall display line increases. As a result, the display line could be recognized in a color different from the color originally intended. Accordingly, an example adjusts the luminance values of the other subpixels in the display line, in response to lighting the adjacent red subpixel and blue subpixel. Hereinafter, examples where unlighted red subpixel and blue subpixel are lighted is described; however, the same description is applicable to the cases where the luminance values of dark lighted red subpixel and blue subpixel are raised.

Figure 9:
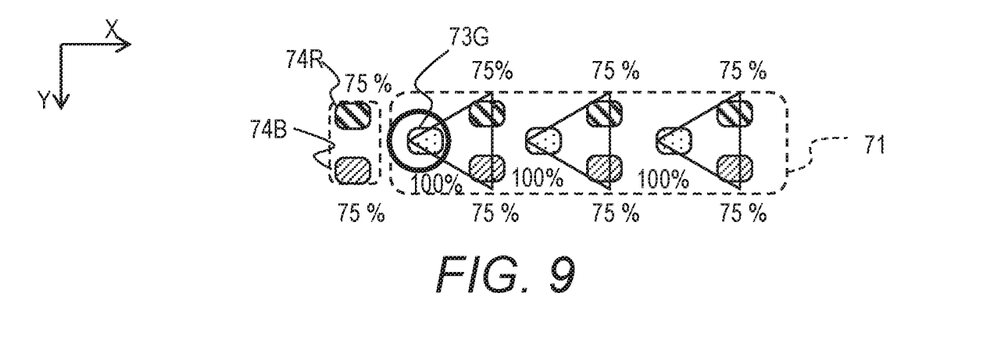
FIG. 9 illustrates adjustment amount of the luminance data for the display line in FIG. 5B where a green subpixel is turned off.

FIG. 9 illustrates adjustment amount of the luminance data for the display line 71 in FIG. 5B after the red subpixel 74R and the blue subpixel 74B are added. The driver IC 134 lowers the luminance values of the red subpixels in the display line 71 to 75% of the original values (at a reduction rate of 25%) and lowers the luminance values of the blue subpixels in the display line 71 to 75% of the original values (at a reduction rate of 25%). The luminance values of the green subpixels are maintained at the original values (100%).

The added red subpixel 74R and blue subpixel 74B are reassigned the total red luminance value and the total blue luminance value reduced from the display line 71. The luminance values of all red subpixels in the white display line 71 and the red subpixel 74R are the same. The luminance values of all blue subpixels in the white display line 71 and the blue subpixel 74B are also the same.

The display line 71 consists of three panel pixels: addition of one red subpixel and one blue subpixel increases the number of red subpixels and blue subpixels to 4/3 times of the original values. Hence, the luminance values of the red subpixels and blue subpixels in the display line 71 are multiplied by 3/4 (75%).

The total luminance value reduced from the red subpixels in the display line 71 (75%=3*25%) are assigned to the added red subpixel 74R and the total luminance value reduced from the blue subpixels in the display line 71 (75%=3*25%) are assigned to the added blue subpixel 74B. As a result, the proportion of the total luminance values of all colors is maintained in the display line 71, so that the display line 71 can be properly kept in white.

Figure 10:
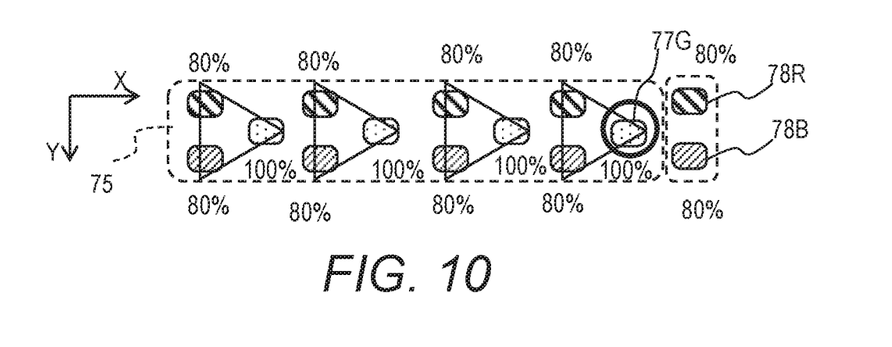
FIG. 10 illustrates adjustment amount of the luminance data for the display line in FIG. 6B where a green subpixel is turned off.

FIG. 10 illustrates adjustment amount of the luminance data for the display line 75 in FIG. 6B after the red subpixel 78R and the blue subpixel 78B are added. The driver IC 134 lowers the luminance values of the red subpixels in the display line 75 to 80% of the original values (at a reduction rate of 20%) and lowers the luminance values of the blue subpixels in the display line 75 to 80% of the original values (at a reduction rate of 20%). The luminance values of the green subpixels are maintained at the original values (100%).

The added red subpixel 78R and blue subpixel 78B are reassigned the total red luminance value and the total blue luminance value reduced from the display line 75. The luminance values of all red subpixels in the white display line 75 and the red subpixel 78R are the same. The luminance values of all blue subpixels in the white display line 75 and the blue subpixel 78B are also the same.

The display line 75 consists of four panel pixels: addition of one red subpixel and one blue subpixel increases the number of red subpixels and blue subpixels to 5/4 times of the original values. Hence, the luminance values of the red subpixels and blue subpixels in the display line 75 are multiplied by 4/5 (80%).

The total luminance value reduced from the red subpixels in the display line 75 (80%=4*20%) are assigned to the added red subpixel 78R and the total luminance value reduced from the blue subpixels in the display line 75 (80%=4*20%) are assigned to the added blue subpixel 78B. As a result, the proportion of the total luminance values of all colors is maintained in the display line 75, so that the display line 75 can be properly kept in white.

Figure 11:
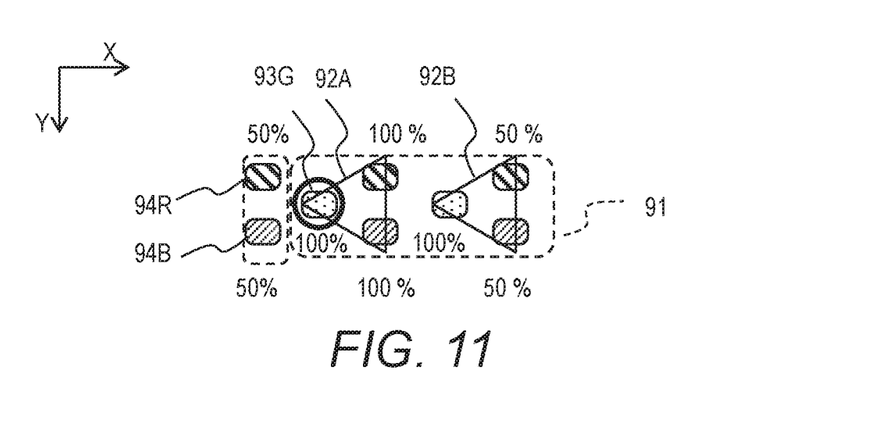
FIG. 11 illustrates another example of adjustment of luminance values of subpixels in the display line by adding red subpixels and blue subpixels to the display line.

FIG. 11 illustrates another example of adjustment of luminance values of subpixels in a display line because of addition of a red subpixel and a blue subpixel to the display line. A red subpixel 94R and a blue subpixel 94B are added to a white display line 91. The display line 91 consists of a panel pixels 92A and 92B. The red subpixel 94R and blue subpixel 94B are subpixels adjacent to the line-end green subpixel 93G in the opposite direction of the X-direction.

As illustrated in FIG. 11, the green subpixels are maintained at the original luminance values (100%). The red subpixels at both ends are reassigned halves (50%) of the original values assigned to the red subpixels in the display line 91. The red subpixels at both ends are the added red subpixel 94R and the red subpixel of the panel pixel 92B. In similar, the blue subpixels at both ends are reassigned halves (50%) of the original values assigned to the blue subpixels in the display line 91. The blue subpixels at both ends are the added blue subpixel 94B and the blue subpixel of the panel pixel 92B.

The red subpixel and blue subpixel at the middle are maintained at the original luminance values (100%). The red subpixel and blue subpixel at the middle are the red subpixel and the blue subpixel of the panel pixel 92A. Lowering the luminance values of the red subpixels and blue subpixels at both ends than the luminance values of the red subpixel and blue subpixel at the middle leads to showing the boundary between the display line 91 and another object more clearly.

The total red luminance value and the total blue luminance value are unchanged before and after the addition of a red subpixel and a blue subpixel. The luminance values of the red subpixels and the blue subpixels can be different from the example in FIG. 11. For example, the red subpixel and blue subpixels at both ends can be reassigned 60% of the original luminance values and the red subpixel and blue subpixel at the middle can be reassigned 80% of the original luminance values.

For a display line in a color different from white, the driver IC 134 can adjust the luminance values of the subpixels remaining after turning on the adjacent red subpixel and blue subpixel. The driver IC 134 may reassign the same luminance values as the luminance values of the red subpixel and the blue subpixel included in the panel pixel including a line-end green subpixel to the red subpixel and the blue subpixel to be added.

In the foregoing examples, the driver IC 134 lowers the luminance values of at least a part of the red subpixels and at least a part of the blue subpixels in the original display line because of the addition of a red subpixel and a blue subpixel. This configuration reduces the change in color of the display line caused by the addition of a red subpixel and a blue subpixel.

In the foregoing examples, the driver IC 134 determines the luminance values of the red subpixels in the display line after addition of a red subpixel and the added red subpixel so that the total luminance value of the red subpixels in the display line and the added red subpixel will be the same as the total luminance value (total red luminance value) of the red subpixels in the display line before the red subpixel is added.

In similar, the driver IC 134 determines the luminance values of the blue subpixels in the display line after addition of a blue subpixel and the added blue subpixel so that the total luminance value of the blue subpixels in the display line and the added blue subpixel will be the same as the total luminance value (total blue luminance value) of the blue subpixels in the display line before the blue subpixel is added. These configurations reduce the change in color of the display line caused by addition of a red subpixel and a blue subpixel. Depending on the design, the total red luminance value or the total blue luminance value after the addition of a red subpixel and a blue subpixel can be different from the total red luminance value or the total blue luminance value before the addition.

Figure 12:
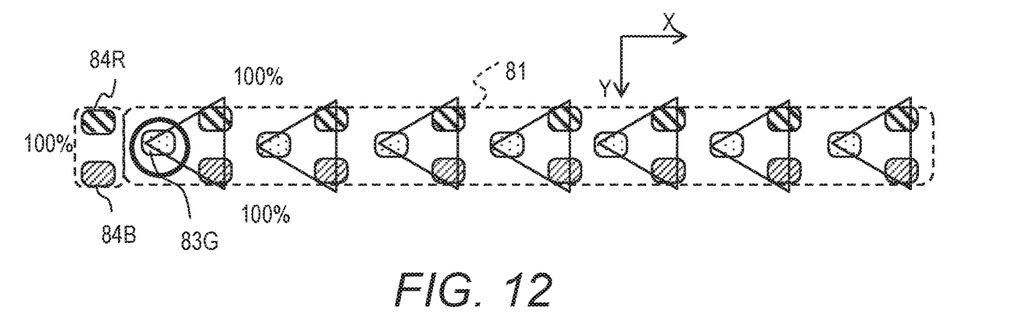
FIG. 12 illustrates adjustment amount of the luminance data for the display line in FIG. 7B where a green subpixel is turned off.

FIG. 12 illustrates luminance data for the display line 81 in FIG. 7B and the lighted red subpixel 84R and blue subpixel 84B. The luminance values of all subpixels in the display line 81 are maintained at the original values (100%). The added red subpixel 84R is reassigned the same luminance value as the luminance value of the red subpixels in the display line 81. The added blue subpixel 84B is reassigned the same luminance value as the luminance value of the blue subpixels in the display line 81.

Figure 13:
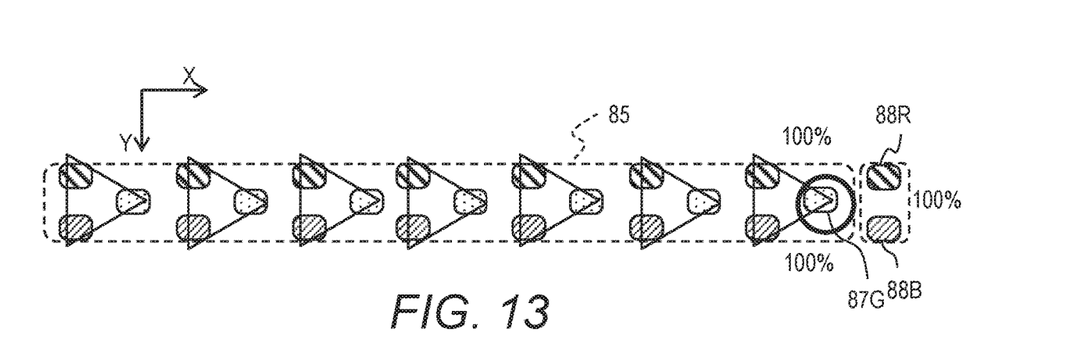
FIG. 13 illustrates adjustment amount of the luminance data for the display line in FIG. 8B where a green subpixel is turned off.

FIG. 13 illustrates luminance data for the display line 85 in FIG. 8B and the lighted red subpixel 88R and blue subpixel 88B. The luminance values of all subpixels in the display line 85 are maintained at the original values (100%). The added red subpixel 88R is reassigned the same luminance value as the luminance value of the red subpixels in the display line 85. The added blue subpixel 88B is reassigned the same luminance value as the luminance value of the blue subpixels in the display line 85.

The display lines 81 and 85 each consists of seven panel pixels. When a display line consists of more than a specific number of panel pixels, the effects of turning on added red subpixel and blue subpixel onto the color of the display line are small. Accordingly, the adjustment of the luminance values because of additional lighting of a red subpixel and a blue subpixel is omitted for the subpixels in a display line consisting of more than a specific number of panel pixels. Depending on the design, the adjustment of the luminance values of the subpixels in the display line can be either performed or omitted independently from the number of constituent panel pixels of the display line.

For a display line showing a color different from white and consisting of more than a specific number of panel pixels, the driver IC 134 can add a red subpixel and a blue subpixel adjacent to the display line. The added red subpixel and blue subpixel are reassigned the luminance values of the red subpixel and the blue subpixel of the panel pixel including a line-end green subpixel.

For example, when dark (for example, zero-luminance) panel pixels consecutive along the X-axis are surrounded by bright (for example, white) panel pixels, a dark line is seen. The green subpixel at an end of each bright display line sandwiching the dark line tends to be conspicuous. The line-end green subpixels of the display lines adjacent to the dark panel pixels can be made less conspicuous by lighting the red subpixels and the blue subpixels of the dark panel pixels adjacent to the display line as described above.

Figure 14:
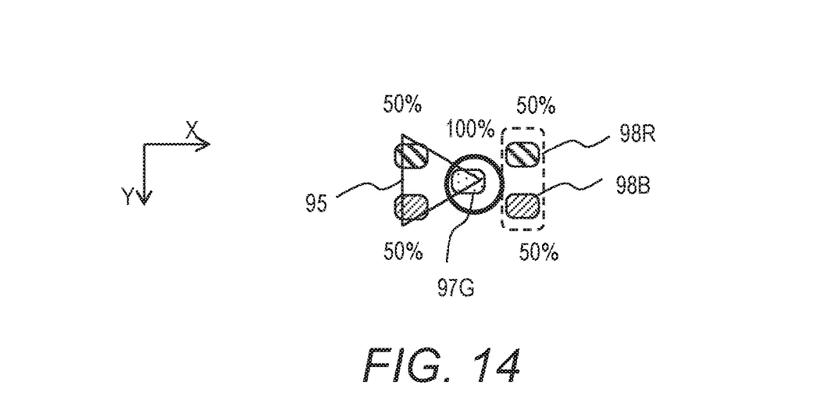
FIG. 14 illustrates an example of the luminance values of a discrete display pixel and newly lighted red subpixel and blue subpixel.

Next, adjustment for a discrete display pixel is described. A discrete display pixel is assigned a luminance value higher than 0 and surrounded by black panel pixels. In other words, the luminance values of the eight panel pixels surrounding the discrete display pixel are 0. The eight adjacent panel pixels are panel pixels adjacent in all directions. Like the line-end green subpixel of a display line, the green subpixel of the discrete display pixel is more conspicuous than the other subpixels to be recognized as a green dot. For this reason, the driver IC 134 turns on (reassigns luminance values higher than 0 to) the red subpixel and the blue subpixel of a panel pixel adjacent to the green subpixel. As a result, the green subpixel can be made less conspicuous.

FIG. 14 illustrates a discrete display pixel 95 and newly lighted red subpixel 98R and blue subpixel 98B. The red subpixel 98R and blue subpixel 98B are subpixels of a panel pixel adjacent to the green subpixel 97G. The green subpixel 97G is sandwiched between the pair of the red subpixel 98R and the blue subpixel 98B and the pair of the red subpixel and the blue subpixel of the discrete display pixel 95.

FIG. 14 illustrates an example of the luminance values of the discrete display pixel 95 and the newly lighted red subpixel 98R and blue subpixel 98B. The total red luminance value and the total blue luminance value may increase because of the addition of the red subpixel 98R and the blue subpixel 98B. Hence, the driver IC 134 lowers the luminance values of the red subpixel and the blue subpixel of the discrete display pixel 95 and further, reassigns the same luminance values as the luminance values of the red subpixel and the blue subpixel of the discrete display pixel 95 to the added red subpixel 98R and blue subpixel 98B.

In the example illustrated in FIG. 14, the luminance values of the red subpixel and the blue subpixel of the discrete display pixel 95 are lowered to a half. As described above, the red added subpixel 98R and blue subpixel 98B are reassigned the same luminance values as the luminance values of the red subpixel and the blue subpixel of the discrete display pixel 95. The luminance value of the green subpixel 97G is maintained. As a result, the total luminance values of the colors of red, blue, and green are unchanged before and after the addition of the red subpixel 98R and the blue subpixel 98B, maintaining the color to be displayed.

As set forth above, embodiments of this disclosure have been described; however, this disclosure is not limited to the foregoing embodiments. Those skilled in the art can easily modify, add, or convert each element in the foregoing embodiment within the scope of this disclosure. A part of the configuration of one embodiment can be replaced with a configuration of another embodiment or a configuration of an embodiment can be incorporated into a configuration of another embodiment.

What is claimed is:

1. A display device comprising:
   a display panel including a plurality of panel pixel lines; and
   a controller configured to control the display panel,
   wherein the plurality of panel pixel lines includes:
      first type of panel pixel lines each composed of a plurality of first type of panel pixels disposed in a first direction; and
      second type of panel pixel lines each composed of a plurality of second type of panel pixels disposed in the first direction,
   wherein the first type of panel pixel lines and the second type of panel pixel lines are disposed alternately in a second direction perpendicular to the first direction,
   wherein each first type of panel pixel includes a first red subpixel and a first blue subpixel disposed in the second direction and a first green subpixel disposed adjacent to the first red subpixel and the first blue subpixel toward a first side of the first direction and between the first red subpixel and the first blue subpixel in the second direction,
   wherein each second type of panel pixel includes a second red subpixel and a second blue subpixel disposed in the second direction and a second green subpixel disposed adjacent to the second red subpixel and the second blue subpixel toward a second side of the first direction and between the second red subpixel and the second blue subpixel in the second direction, and
   wherein the controller is configured to:
      receive image data for a picture frame;
      generate luminance data for the display panel from the image data;
      modify the luminance data for the display panel by raising luminance values of a first red subpixel and a first blue subpixel adjacent to a first green subpixel located at an end of a first display line, the first display line being composed of a plurality of the first type of panel pixels consecutively arranged toward the first side of the first direction and assigned luminance values higher than 0; and
      modify the luminance data for the display panel by raising luminance values of a second red subpixel and a second blue subpixel adjacent to a second green subpixel located at an end of a second display line, the second display line being composed of a plurality of the second type of panel pixels consecutively arranged toward the second side of the first direction and assigned luminance values higher than 0.

2. The display device according to claim 1, wherein the controller is configured to modify the luminance data for the display panel by lowering luminance values of at least a part of first red subpixels and at least a part of first blue subpixels included in the first display line and luminance values of at least a part of second red subpixels and at least a part of second blue subpixels included in the second display line.

3. The display device according to claim 2,
   wherein a total luminance value of modified luminance values of the first red subpixels included in the first display line and a luminance value of the adjacent first red subpixel is equal to a total luminance value of the first red subpixels included in the first display line before the modification,
   wherein a total luminance value of modified luminance values of the first blue subpixels included in the first display line and a luminance value of the adjacent first blue subpixel is equal to a total luminance value of the first blue subpixels included in the first display line before the modification,
   wherein a total luminance value of modified luminance values of the second red subpixels included in the second display line and a luminance value of the adjacent second red subpixel is equal to a total luminance value of the second red subpixels included in the second display line before the modification, and
   wherein a total luminance value of modified luminance values of the second blue subpixels included in the second display line and a luminance value of the adjacent second blue subpixel is equal to a total luminance value of the second blue subpixels included in the second display line before the modification.

4. The display device according to claim 2, wherein the controller is configured to modify the luminance data for the display panel by lowering luminance values of all first red subpixels and first blue subpixels in the first display line at a same rate and luminance values of all second red subpixels and second blue subpixels in the second display line at the same rate.

5. The display device according to claim 4, wherein the controller is configured to modify the luminance data for the display panel by:
   reassigning a luminance value reduced from the total luminance value of the all first red subpixels in the first display line to the adjacent first red subpixel;
   reassigning a luminance value reduced from the total luminance value of the all first blue subpixels in the first display line to the adjacent first blue subpixel;
   reassigning a luminance value reduced from the total luminance value of the all second red subpixels in the second display line to the adjacent second red subpixel; and
   reassigning a luminance value reduced from the total luminance value of the all second blue subpixels in the second display line to the adjacent second blue subpixel.

6. The display device according to claim 2,
   wherein a reduction rate of luminance values of first red subpixels at both ends of the first display line is higher than a reduction rate of a luminance value of a first red subpixel at the middle of the first display line,
   wherein a reduction rate of luminance values of first blue subpixels at both ends of the first display line is higher than a reduction rate of a luminance value of a first blue subpixel at the middle of the first display line,
   wherein a reduction rate of luminance values of second red subpixels at both ends of the second display line is higher than a reduction rate of a luminance value of a second red subpixel at the middle of the first display line, and
   wherein a reduction rate of luminance values of second blue subpixels at both ends of the second display line is higher than a reduction rate of a luminance value of a second blue subpixel at the middle of the first display line.

7. The display device according to claim 2, wherein the controller is configured to select the first display line and the second display line from display lines consisting of fewer than a predetermined number of panel pixels.

8. A method of controlling a display device,
the display device including a display panel including a plurality of panel pixel lines,
the plurality of panel pixel lines including:
   first type of panel pixel lines each composed of a plurality of first type of panel pixels disposed in a first direction; and
   second type of panel pixel lines each composed of a plurality of second type of panel pixels disposed in the first direction,
the first type of panel pixel lines and the second type of panel pixel lines being disposed alternately in a second direction perpendicular to the first direction,
each first type of panel pixel including a first red subpixel and a first blue subpixel disposed in the second direction and a first green subpixel disposed adjacent to the first red subpixel and the first blue subpixel toward a first side of the first direction and between the first red subpixel and the first blue subpixel in the second direction,
each second type of panel pixel including a second red subpixel and a second blue subpixel disposed in the second direction and a second green subpixel disposed adjacent to the second red subpixel and the second blue subpixel toward a second side of the first direction and between the second red subpixel and the second blue subpixel in the second direction, and
the method comprising:
   receiving image data for a picture frame;
   generating luminance data for the display panel from the image data;
   modifying the luminance data for the display panel by raising luminance values of a first red subpixel and a first blue subpixel adjacent to a first green subpixel located at an end of first display line, the first display line being composed of a plurality of the first type of panel pixels consecutively arranged toward the first side of the first direction and assigned luminance values higher than 0, and
   modifying the luminance data for the display panel by raising luminance values of a second red subpixel and a second blue subpixel adjacent to a second green subpixel located at an end of a second display line, the second display line being composed of a plurality of the second type of panel pixels consecutively arranged toward the second side of the first direction and assigned luminance values higher than 0.

* * * * *